United States Patent
Lee et al.

(10) Patent No.: US 9,934,950 B2
(45) Date of Patent: Apr. 3, 2018

(54) SPUTTERING APPARATUSES AND METHODS OF MANUFACTURING A MAGNETIC MEMORY DEVICE USING THE SAME

(71) Applicants: Joonmyoung Lee, Anyang-si (KR); Woojin Kim, Yongin-si (KR)

(72) Inventors: Joonmyoung Lee, Anyang-si (KR); Woojin Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 66 days.

(21) Appl. No.: 15/202,597

(22) Filed: Jul. 6, 2016

(65) Prior Publication Data

US 2017/0110301 A1    Apr. 20, 2017

(30) Foreign Application Priority Data

Oct. 16, 2015 (KR) .......................... 10-2015-0144839
Dec. 11, 2015 (KR) .......................... 10-2015-0177279

(51) Int. Cl.
*H01J 37/34* (2006.01)
*C23C 14/34* (2006.01)
(Continued)

(52) U.S. Cl.
CPC .......... *H01J 37/3488* (2013.01); *C23C 14/08* (2013.01); *C23C 14/3464* (2013.01);
(Continued)

(58) Field of Classification Search
CPC . C23C 14/3464; H01J 37/32715; H01J 37/34; H01J 37/3426; H01J 37/3447;
(Continued)

(56) References Cited

U.S. PATENT DOCUMENTS 7,338,581 B2    3/2008 Noda
7,510,634 B1    3/2009 Klawuhn et al.
(Continued)

FOREIGN PATENT DOCUMENTS

JP    H07-238371 A    9/1995
JP    09-241838    *    9/1997
(Continued)

OTHER PUBLICATIONS

Feng et al. "Annealing of CoFeB/MgO based single and double barrier magnetic tunnel junctions: Tunnel Magnetoresistance, bias dependence and output voltage", Journal of Applied Physics 105 (Feb. 2009).*

*Primary Examiner* — Rodney G McDonald

(74) *Attorney, Agent, or Firm* — Myers Bigel, P.A.

(57) ABSTRACT

A sputtering apparatus includes a process chamber in which a sputtering process is performed, a substrate holder provided in the process chamber and fixing a horizontal position of a substrate during the sputtering process, and a first sputter gun provided to be vertically spaced apart from the substrate in the process chamber. The first sputter gun is spaced apart from the substrate by a first horizontal distance during the sputtering process. The first sputter gun is fixed during the sputtering process. The first horizontal distance is a horizontal distance between the substrate and the first sputter gun when viewed from a plan view.

15 Claims, 13 Drawing Sheets

(51) Int. Cl.
  *H01J 37/32* (2006.01)
  *H01L 43/08* (2006.01)
  *H01L 43/10* (2006.01)
  *H01L 43/12* (2006.01)
  *C23C 14/08* (2006.01)
  *C23C 14/50* (2006.01)

(52) U.S. Cl.
  CPC ...... *C23C 14/505* (2013.01); *H01J 37/32715* (2013.01); *H01J 37/34* (2013.01); *H01J 37/3426* (2013.01); *H01J 37/3447* (2013.01); *H01L 43/08* (2013.01); *H01L 43/10* (2013.01); *H01L 43/12* (2013.01)

(58) Field of Classification Search
  CPC .......... H01J 37/3488; H01J 2237/3322; H01L 27/228; H01L 43/08; H01L 43/10; H01L 43/12
  USPC ............... 204/192.2, 298.11, 298.18, 298.26
  See application file for complete search history.

(56) References Cited

U.S. PATENT DOCUMENTS

| | | |
|---|---|---|
| 8,147,657 B2 | 4/2012 | Takasawa et al. |
| 2002/0144903 A1* | 10/2002 | Kim ............ C23C 14/225 204/298.18 |
| 2014/0262752 A1 | 9/2014 | Vergöhl et al. |

FOREIGN PATENT DOCUMENTS

| | | | |
|---|---|---|---|
| JP | 2005-036250 | A | 2/2005 |
| JP | 2013-171273 | A | 9/2013 |
| JP | 5405549 | B2 | 11/2013 |
| JP | 5442367 | B2 | 12/2013 |
| KR | 2001-098215 | * | 11/2001 |
| KR | 10-1255524 | B1 | 4/2013 |
| KR | 10-2013-0100949 | A | 9/2013 |
| KR | 10-1372359 | B1 | 3/2014 |

* cited by examiner

SPUTTERING APPARATUSES AND METHODS OF MANUFACTURING A MAGNETIC MEMORY DEVICE USING THE SAME

CROSS-REFERENCE TO RELATED APPLICATION

This U.S. non-provisional patent application claims priority under 35 U.S.C. § 119 to Korean Patent Application Nos. 10-2015-0144839 and 10-2015-0177279, filed on Oct. 16, 2015 and Dec. 11, 2015, respectively, in the Korean Intellectual Property Office, the disclosures of which are hereby incorporated herein by reference in their entireties.

FIELD

Embodiments of the inventive concepts relate to sputtering apparatuses for depositing a thin layer and methods of manufacturing magnetic memory devices using the same.

BACKGROUND

As high-speed and/or low power consumption electronic devices have been demanded, semiconductor memory devices used therein have needed to have high-speed characteristics and/or low operating voltages. Magnetic memory devices have been developed as semiconductor memory devices capable of satisfying these needs. The magnetic memory devices may have high-speed and/or non-volatile characteristics so as to emerge as next-generation semiconductor memory devices.

In general, a magnetic memory device may include a magnetic tunnel junction (MTJ) pattern. The magnetic tunnel junction pattern may include two magnetic layers and an insulating layer disposed between the two magnetic layers. A resistance value of the magnetic tunnel junction pattern may be changed depending on magnetization directions of the two magnetic layers. For example, when the magnetization directions of the two magnetic layers are anti-parallel (i.e., not parallel) to each other, the magnetic tunnel junction pattern may have a high resistance value. When the magnetization directions of the two magnetic layers are parallel to each other, the magnetic tunnel junction pattern may have a low resistance value. The magnetic memory device may read/write data using a difference between the resistance values of the magnetic tunnel junction pattern.

The insulating layer included in the magnetic tunnel junction pattern may be deposited using a sputtering process.

SUMMARY

Embodiments of the inventive concepts may provide sputtering apparatuses capable of reducing or minimizing contamination of a substrate provided therein.

Embodiments of the inventive concepts may also provide methods of manufacturing a magnetic memory device with excellent reliability.

In an aspect, a sputtering apparatus may include a process chamber in which a sputtering process is performed, a substrate holder provided in the process chamber and fixing a horizontal position of a substrate during the sputtering process, and a first sputter gun provided to be vertically spaced apart from the substrate in the process chamber. The first sputter gun may be spaced apart from the substrate by a first horizontal distance during the sputtering process. The first sputter gun may be fixed during the sputtering process. The first horizontal distance may be a horizontal distance between the substrate and the first sputter gun when viewed from a plan view.

In some embodiments, the sputtering apparatus may further include a second sputter gun provided to be vertically spaced apart from the substrate in the process chamber. The second sputter gun may be spaced apart from the substrate by a second horizontal distance during the sputtering process. The second sputter gun may be fixed during the sputtering process. The second sputter gun may be horizontally spaced apart from the first sputter gun. The second horizontal distance may be a horizontal distance between the substrate and the second sputter gun when viewed from a plan view.

In some embodiments, each of the first and second sputter guns may be fixed at a position not vertically overlapping with the substrate during the sputtering process.

In some embodiments, the first sputter gun may include a first target, and the second sputter gun may include a second target. The second target may include the same material as the first target.

In some embodiments, the first target and the second target may include a metal oxide.

In some embodiments, the first sputter gun may further include a first plate supplying power to the first target. The first target may have a first surface being in direct contact with the first plate and a second surface opposite to the first surface. The first sputter gun may be disposed such that the second surface of the first target is pointed toward inside of the process chamber. A first angle between a normal line perpendicular to the second surface of the first target and a normal line perpendicular to the top surface of the substrate may range from about 60 degrees to about 90 degrees.

In some embodiments, the second sputter gun may further include a second plate supplying power to the second target. The second target may have a first surface and a second surface opposite to each other, and the first surface of the second target may be in direct contact with the second plate. The second sputter gun may be disposed such that the second surface of the second target is pointed toward inside of the process chamber. A second angle between a normal line perpendicular to the second surface of the second target and the normal line perpendicular to the top surface of the substrate may range from about 60 degrees to about 90 degrees.

In some embodiments, the first angle and the second angle may be equal to each other.

In some embodiments, the first sputter gun and the second sputter gun may face each other.

In some embodiments, the sputtering apparatus may further include a shutter provided over the substrate in the process chamber to protect the substrate during a pre-sputtering process performed on the first and second targets. The shutter may be disposed at a lower height than the first and second sputter guns from the substrate. The shutter may have a plate shape having a first length in a direction parallel to the top surface of the substrate and a second length in a direction perpendicular to the top surface of the substrate. The first length of the plate shape may be greater than the second length of the plate shape.

In some embodiments, the first sputter gun and the second sputter gun may be provided at one side of the substrate when viewed from a cross-sectional view. The first sputter gun and the second sputter gun may be arranged in one direction when viewed from a plan view.

In some embodiments, the sputtering apparatus may further include a shutter provided in the process chamber to protect the substrate during a pre-sputtering process performed on the first and second targets. The shutter may be provided at one side of the substrate. Each of the first and second sputter guns may be spaced apart from the substrate with the shutter interposed therebetween. The shutter may have a plate shape that extends in the arrangement direction of the first and second sputter guns and that extends in a direction perpendicular to the top surface of the substrate.

In an aspect, a method of manufacturing a magnetic memory device may include forming a first magnetic layer on a substrate, forming a non-magnetic layer on the first magnetic layer, and forming a second magnetic layer on the non-magnetic layer. The forming of the non-magnetic layer may include providing a first sputter gun above the first magnetic layer, the first sputter gun vertically spaced apart from the first magnetic layer, the first sputter gun including a first target, and performing a sputtering process using the first sputter gun. The first sputter gun may be spaced apart from the substrate by a first horizontal distance during the sputtering process. The first sputter gun may be fixed during the sputtering process. The first horizontal distance is a horizontal distance between the substrate and the first sputter gun when viewed from a plan view.

In some embodiments, the forming of the non-magnetic layer may further include providing a second sputter gun above the first magnetic layer, the second sputter gun vertically spaced apart from the first magnetic layer, and the second sputter gun comprising a second target. The second sputter gun may be horizontally spaced apart from the first sputter gun. The sputtering process may be performed using the first sputter gun and the second sputter gun at the same time. The second sputter gun may be spaced apart from the substrate by a second horizontal distance during the sputtering process. The second sputter gun may be fixed during the sputtering process. The second horizontal distance may be a horizontal distance between the substrate and the second sputter gun when viewed from a plan view.

In some embodiments, each of the first and second sputter guns may be fixed at a position not vertically overlapping with the substrate during the sputtering process.

In some embodiments, the first target and the second target may include the same material.

In some embodiments, the first target and the second target may include a metal oxide.

In some embodiments, the first sputter gun may further include a first plate supplying power to the first target. The first target may have a first surface and a second surface opposite to each other, and the first surface of the first target may be in direct contact with the first plate. The second sputter gun may further include a second plate supplying power to the second target. The second target may have a first surface and a second surface opposite to each other, and the first surface of the second target may be in direct contact with the second plate. A first angle between a normal line perpendicular to the second surface of the first target and a normal line perpendicular to the top surface of the substrate may range from about 60 degrees to about 90 degrees. A second angle between a normal line perpendicular to the second surface of the second target and the normal line perpendicular to the top surface of the substrate may range from about 60 degrees to about 90 degrees.

In some embodiments, the first sputter gun and the second sputter gun may face each other above the first magnetic layer.

In some embodiments, the first sputter gun and the second sputter gun may be provided at one side of the substrate when viewed from a cross-sectional view. The first sputter gun and the second sputter gun may be arranged in one direction when viewed from a plan view.

In some embodiments, the first sputter gun may further include a first plate supplying power to the first target. The first target may have a first surface and a second surface opposite to each other, and the first surface of the first target may be in direct contact with the first plate. The second sputter gun may further include a second plate supplying power to the second target. The second target may have a first surface and a second surface opposite to each other, and the first surface of the second target may be in direct contact with the second plate.

In some embodiments, the sputtering process may be a radio-frequency (RF) sputtering process.

In some embodiments, the method may further include patterning the second magnetic layer, the non-magnetic layer, and the first magnetic layer to form a magnetic tunnel junction pattern. The non-magnetic layer may be a tunnel barrier of the magnetic tunnel junction pattern.

In some embodiments, the non-magnetic layer, the first target, and the second target may include the same material.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
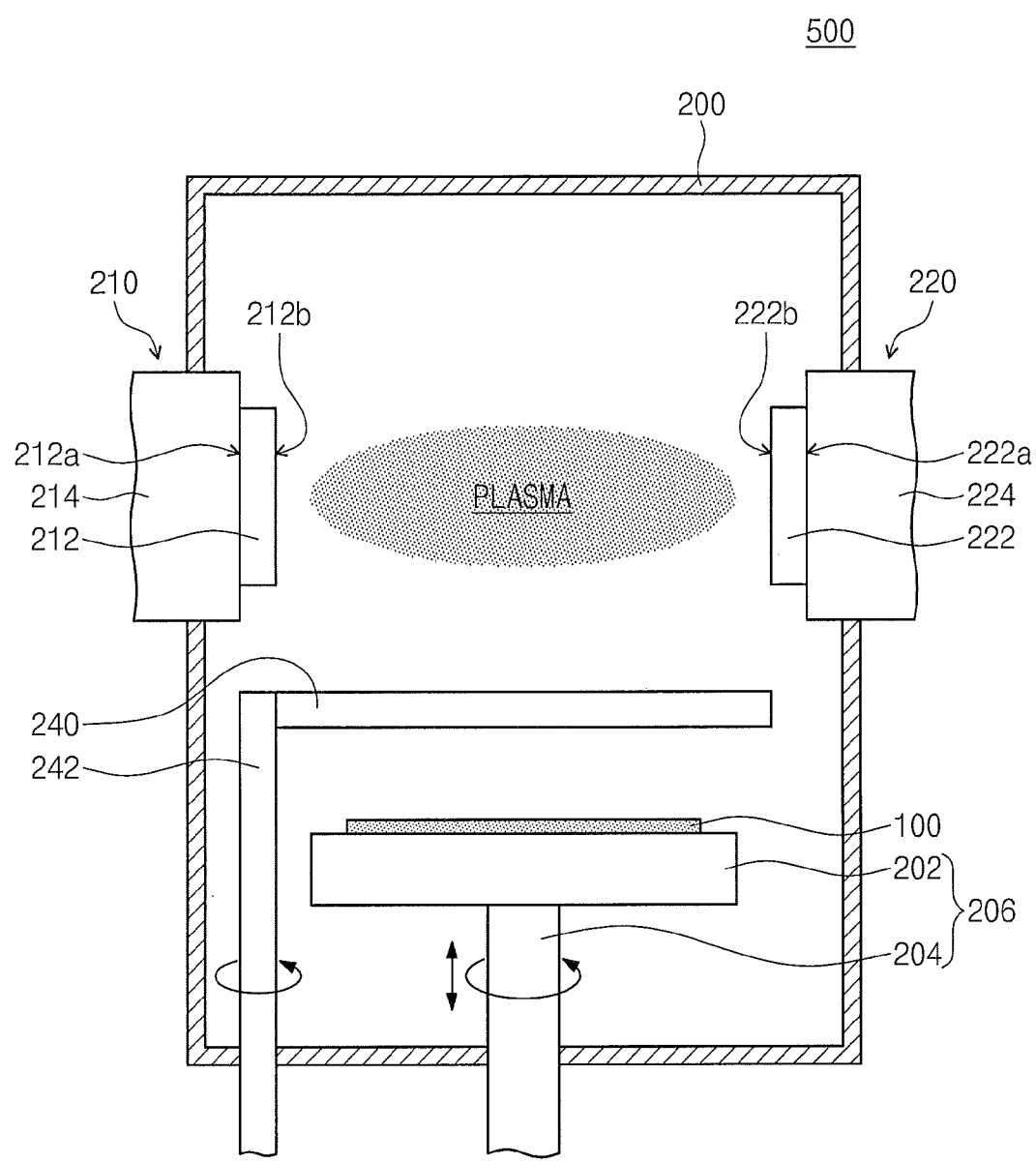
FIG. 1 is a cross-sectional view illustrating a sputtering apparatus according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments of aspects of the present inventive concepts explained and illustrated herein include their complementary counterparts. The same reference numerals or the same reference designators denote the same elements throughout the specification.

Figure 2:
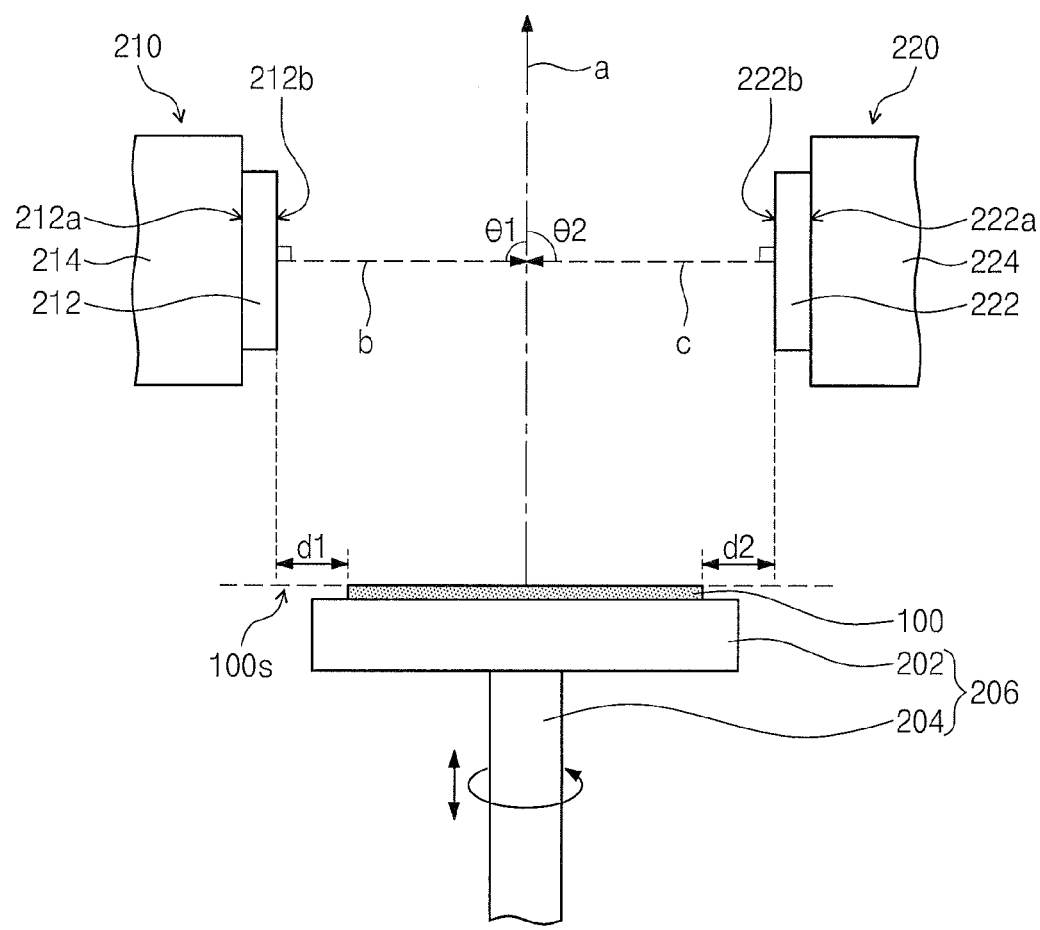
FIG. 2 is a cross-sectional view illustrating first and second sputter guns of FIG. 1.

FIG. 1 is a cross-sectional view illustrating a sputtering apparatus according to some embodiments of the inventive concepts. FIG. 2 is a cross-sectional view illustrating first and second sputter guns of FIG. 1.

Referring to FIGS. 1 and 2, a sputtering apparatus 500 may include a process chamber 200 in which a sputtering process is performed. The process chamber 200 may be a vacuum chamber, and the sputtering process may be a process for depositing a thin layer. The sputtering apparatus 500 may include a substrate holder 206 provided in the process chamber 200 and a plurality of sputter guns provided in the process chamber 200. The substrate holder 206 may be used to load the substrate 100, and the plurality of sputter guns may be vertically spaced apart from the loaded substrate 100 (i.e., the substrate holder 206).

The substrate holder 206 may include a stage 202 on which the substrate 100 is loaded, and a supporter 204 supporting the stage 202. The supporter 204 may rotate the stage 202 and/or may vertically move the stage 202 to control a vertical position of the stage 202. A horizontal position of the stage 202 may be fixed by the supporter 204. Thus, the substrate holder 206 may fix a horizontal position of the substrate 100 loaded on the stage 202.

The plurality of sputter guns may include a first sputter gun 210 and a second sputter gun 220 that are horizontally spaced apart from each other above the substrate 100. Hereinafter, the two sputter guns will be described as an example. However, embodiments of the inventive concepts are not limited thereto. The first sputter gun 210 and the second sputter gun 220 may include a first target 212 and a second target 222, respectively. In other words, the first and second sputter guns 210 and 220 may be equipped with the first and second targets 212 and 222, respectively. Each of the first and second targets 212 and 222 may be formed of an insulating material. The first and second targets 212 and 222 may include the same material.

The first sputter gun 210 may include a first plate 214 supplying power to the first target 212. The first target 212 may have a first surface 212a being in direct contact with the first plate 214, and a second surface 212b opposite to the first surface 212a. The first sputter gun 210 may be disposed such that the second surface 212b of the first target 212 is pointed toward inside of the process chamber 200. As illustrated in FIG. 2, a normal line a perpendicular to a top surface of the substrate 100 may form a first angle θ1 with a normal line b perpendicular to the second surface 212b of the first target 212. The first angle θ1 may range from about 60 degrees to about 90 degrees. The second sputter gun 220 may include a second plate 224 supplying power to the second target 222. The second target 222 may have a first surface 222a being in direct contact with the second plate 224, and a second surface 222b opposite to the first surface 222a. The second sputter gun 220 may be disposed such that the second surface 222b of the second target 222 is pointed toward inside of the process chamber 200. As illustrated in FIG. 2, the normal line a perpendicular to the top surface of the substrate 100 may form a second angle θ2 with a normal line c perpendicular to the second surface 222b of the second target 222. The second angle θ2 may range from about 60 degrees to about 90 degrees. In some embodiments, the first angle θ1 may be equal to the second angle θ2. When the number of the plurality of sputter guns is an even number, at least a pair of sputter guns (e.g., the first and second sputter guns 210 and 220) among the sputter guns may face each other in the process chamber 200. In other words, the first sputter gun 210 may be opposite to the second sputter gun 220.

The first sputter gun 210 may be spaced apart from the substrate 100 by a first horizontal distance d1 and may be fixed. That is, the first sputter gun 210 may be spaced apart from a first sidewall of the substrate 100 by the first horizontal distance d1. In other words, the first sputter gun 210 may be laterally spaced apart from the first sidewall of the substrate 100 by the first horizontal distance d1 when viewed from a plan view. The first horizontal distance d1 may be a horizontal distance measured from the first sidewall of the substrate 100 to the first sputter gun 210 projected on an imaginary horizontal plane 100s laterally extending from the top surface of the substrate 100. In other words, the first horizontal distance d1 may be a horizontal distance between the substrate 100 and the first sputter gun 210 when viewed from a plan view. Thus, the first sputter gun 210 may be fixed at a position that does not vertically overlap with the substrate 100. The second sputter gun 220 may be spaced apart from the substrate 100 by a second horizontal distance d2 and may be fixed. That is, the second sputter gun 220 may be spaced apart from a second sidewall of the substrate 100 by the second horizontal distance d2. In other words, the second sputter gun 220 may be laterally spaced apart from the second sidewall of the substrate 100 by the second horizontal distance d2 when viewed from a plan view. The second sidewall of the substrate 100 may be opposite to the first sidewall of the substrate 100. The second horizontal distance d2 may be a horizontal distance measured from the second sidewall of the substrate 100 to the second sputter gun 220 projected on the imaginary horizontal plane 100s. In other words, the second horizontal distance d2 may be a horizontal distance between the substrate 100 and the second sputter gun 220 when viewed from a plan view. Thus, the second sputter gun 220 may be fixed at a position that does not vertically overlap with the substrate 100. In some embodiments, the first horizontal distance d1 may be substantially equal to the second horizontal distance d2.

While the sputtering process is performed in the process chamber 200, the substrate holder 206 may fix the horizontal position of the substrate 100 and the first and second sputter guns 210 and 220 may be fixed at the positions not vertically overlapping with the substrate 100, respectively.

When the sputtering process is performed in the process chamber 200, the first and second targets 212 and 222 may be sputtered by plasma generated using a source gas (e.g., an argon (Ar) gas) provided in the process chamber 200. A portion of sputtering sources generated from the first and second targets 212 and 222 may be deposited on the substrate 100 to form a thin layer on the substrate 100. Another portion of the sputtering sources may be deposited on outer surfaces of the first and second sputter guns 210 and 220. During or after the sputtering process, the sputtering sources deposited on the outer surfaces of the first and second sputter guns 210 and 220 may be detached from the outer surfaces of the first and second sputter guns 210 and 220 and fall onto the substrate 100. The detached sputtering sources may cause contamination of the substrate 100.

According to some embodiments of the inventive concepts, the first and second sputter guns 210 and 220 may be fixed to be spaced apart from the substrate 100 by the first and second horizontal distances d1 and d2, respectively. In other words, during the sputtering process, the first and second sputter guns 210 and 220 may be fixed at the positions such that the first and second sputter guns 210 and 220 do not vertically overlap with the substrate 100. Thus, when the sputtering sources deposited on the outer surfaces of the first and second sputter guns 210 and 220 are detached therefrom, it is possible to inhibit the detached sputtering sources from falling onto the substrate 100. As a result, it is possible to inhibit the substrate 100 from being contaminated by the detached sputtering sources.

The sputtering apparatus 500 may include a shutter 240 provided over the substrate 100 in the process chamber 200, and a shutter supporter 242 provided in the process chamber 200 to support the shutter 240. The shutter 240 may be disposed at a lower height (or level) than the first and second sputter guns 210 and 220 from the substrate 100 (i.e. the substrate holder 206). The shutter 240 may have a plate shape having a first length in a direction parallel to the top surface of the substrate 100 and a second length in a direction perpendicular to the top surface of the substrate 100. The first length may be greater than the second length. Even though not shown in the drawings, the shutter 240 may have a circular shape when viewed from a plan view. However, embodiments of the inventive concepts are not limited thereto. The shutter supporter 242 may rotate the shutter 240 and/or may horizontally move the shutter 240.

The shutter 240 may protect the substrate 100 during a pre-sputtering process. The pre-sputtering process may be performed in the process chamber 200 before the sputtering process to remove impurities existing on surfaces of the first and second targets 212 and 222. The shutter 240 may be provided to cover the top surface of the substrate 100 during the pre-sputtering process and may protect the substrate 100 from the impurities detached from the first and second targets 212 and 222 by the pre-sputtering process. In other words, the shutter 240 may inhibit the substrate 100 from being contaminated by the falling impurities during the pre-sputtering process. After the pre-sputtering process, the shutter 240 may be moved by the shutter supporter 242 to expose the top surface of the substrate 100. Thereafter, the sputtering process may be performed on the exposed top surface of the substrate 100.

Figure 3:
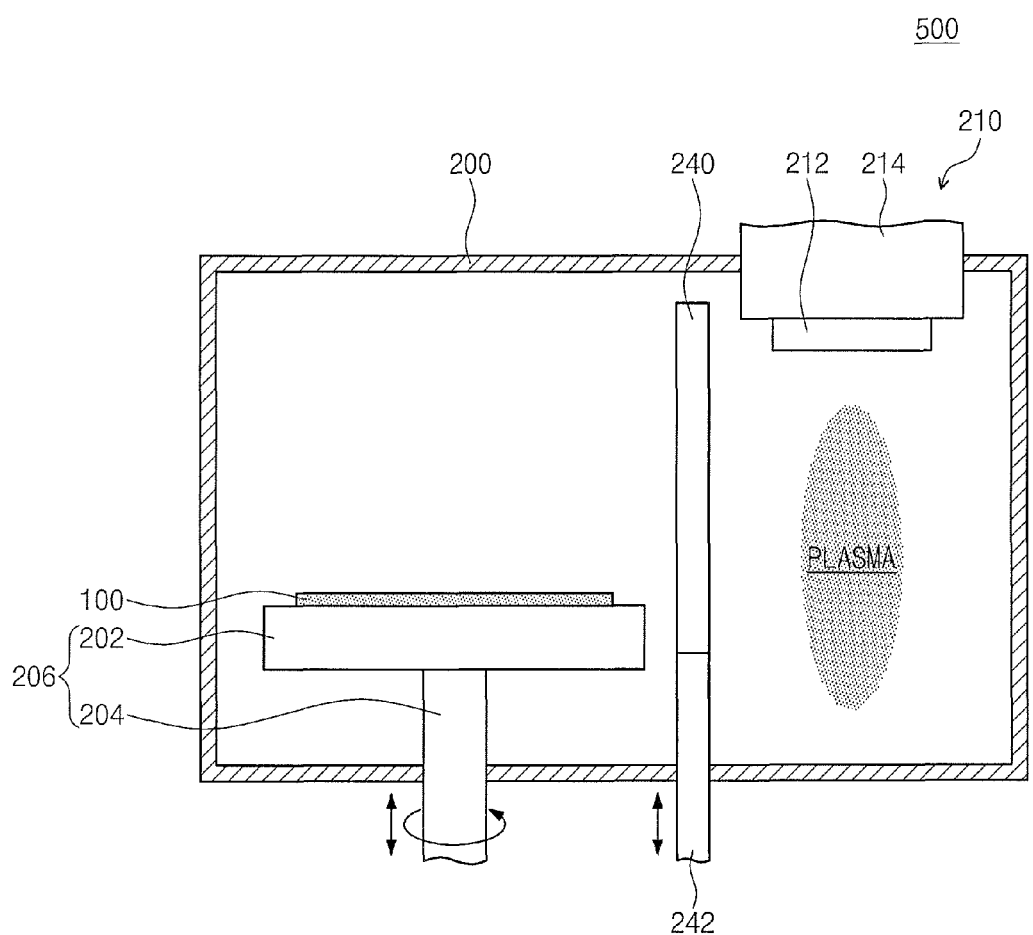
FIG. 3 is a cross-sectional view illustrating a sputtering apparatus according to some embodiments of the inventive concepts.
Figure 4:
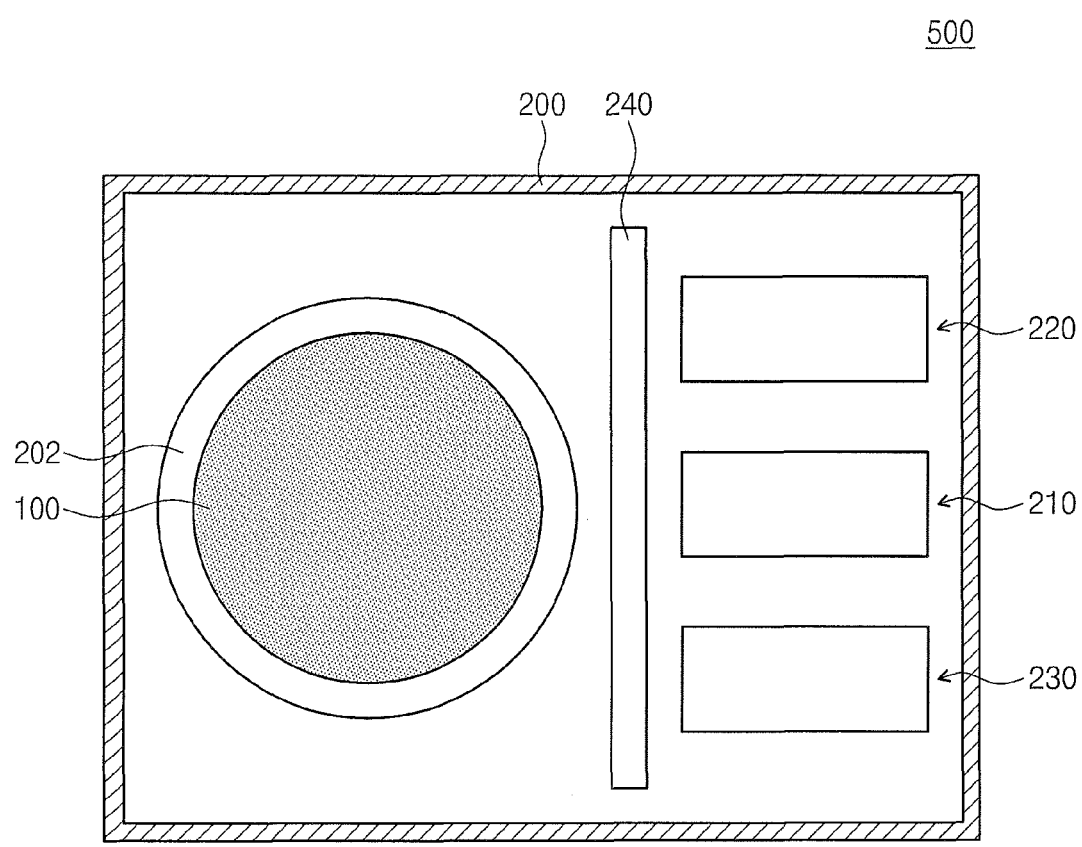
FIG. 4 is a plan view illustrating the sputtering apparatus of FIG. 3.
Figure 5:
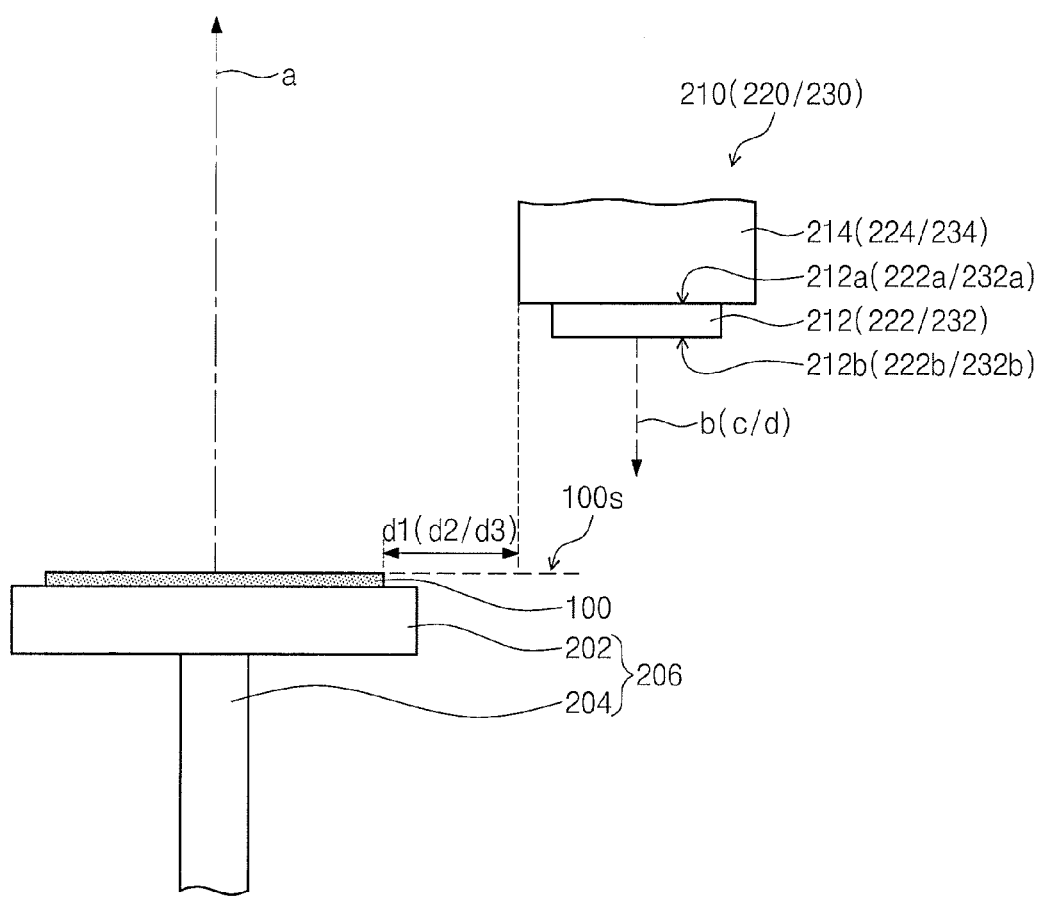
FIG. 5 is a cross-sectional view illustrating first to third sputter guns of FIGS. 3 and 4.
Figure 6:
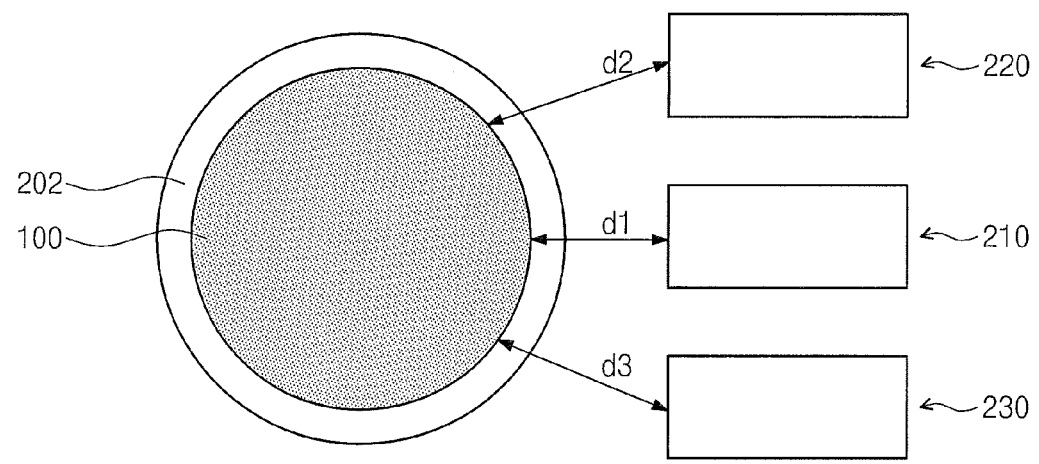
FIG. 6 is a plan view illustrating the first to third sputter guns of FIGS. 3 and 4.

FIG. 3 is a cross-sectional view illustrating a sputtering apparatus according to some embodiments of the inventive concepts, and FIG. 4 is a plan view illustrating the sputtering apparatus of FIG. 3. FIG. 5 is a cross-sectional view illustrating first to third sputter guns of FIGS. 3 and 4, and FIG. 6 is a plan view illustrating the first to third sputter guns of FIGS. 3 and 4. Hereinafter, the same descriptions as in the embodiments of FIGS. 1 and 2 will be omitted or mentioned briefly for the purpose of ease and convenience in explanation.

Referring to FIGS. 3 to 6, a sputtering apparatus 500 may include a process chamber 200 in which a sputtering process is performed. The process chamber 200 may be a vacuum chamber, and the sputtering process may be a process for depositing a thin layer. The sputtering apparatus 500 may include a substrate holder 206 provided in the process chamber 200 to load a substrate 100 and a plurality of sputter guns provided in the process chamber 200. The plurality of sputter guns may be vertically spaced apart from the loaded substrate 100. The plurality of sputter guns may be disposed at one side of the substrate 100 (i.e., the substrate holder 206) when viewed from one cross-sectional view.

The substrate holder 206 may include a stage 202 on which the substrate 100 is loaded, and a supporter 204 supporting the stage 202. The supporter 204 may rotate the stage 202 and/or may vertically move the stage 202 to control a vertical position of the stage 202. A horizontal position of the stage 202 may be fixed by the supporter 204. Thus, the substrate holder 206 may fix a horizontal position of the substrate 100 loaded on the stage 202.

The plurality of sputter guns may include a first sputter gun 210, a second sputter gun 220, and a third sputter gun 230 that are spaced apart from each other at one side of the substrate 100, as illustrated. In the present embodiment, the three sputter guns will be described as an example. However, embodiments of the inventive concepts are not limited thereto. The first to third sputter guns 210, 220, and 230 may be arranged in one direction (or, unlike shown, along a sidewall of the substrate 100) at the one side of the substrate 100 when viewed from a plan view.

The first sputter gun 210, the second sputter gun 220, and the third sputter gun 230 may include a first target 212, a second target 222, and a third target 232, respectively. In other words, the first, second and third sputter guns 210, 220 and 230 may be equipped with the first, second and third targets 212, 222 and 232, respectively. Each of the first to third targets 212, 222 and 232 may be formed of an insulating material. The first to third targets 212, 222 and 232 may include the same material.

The first sputter gun 210 may include a first plate 214 supplying power to the first target 212. The first target 212 may have a first surface 212a being in direct contact with the first plate 214, and a second surface 212b opposite to the first surface 212a. The first sputter gun 210 may be disposed such that the second surface 212b of the first target 212 is pointed toward inside of the process chamber 200. As illustrated in FIG. 5, the first sputter gun 210 may be disposed such that a normal line a perpendicular to a top surface of the substrate 100 is parallel to a normal line b perpendicular to the second surface 212b of the first target 212. In other words, a first angle between the normal line a of the top surface of the substrate 100 and the normal line b of the second surface 212b of the first target 212 may be about 0 degree. In certain embodiments, unlike FIG. 5, the first sputter gun 210 may be disposed in such a way that the first target 212 is inclined to the substrate 100 at a predetermined angle. In other words, the second surface 212b of the first target 212 may be pointed toward the substrate 100. In this case, the first angle may be greater than about 0 degree and smaller than about 60 degrees. Likewise, the second sputter gun 220 may include a second plate 224 supplying power to the second target 222. The second target 222 may have a first surface 222a being in direct contact with the second plate 224, and a second surface 222b opposite to the first surface 222a. The second sputter gun 220 may be disposed such that the second surface 222b of the second target 222 is pointed toward inside of the process chamber 200. As illustrated in FIG. 5, the second sputter gun 220 may be disposed such that the normal line a perpendicular to the top surface of the substrate 100 is parallel to a normal line c perpendicular to the second surface 222b of the second target 222. In other words, a second angle between the normal line a of the top surface of the substrate 100 and the normal line c of the second surface 222b of the second target 222 may be about 0 degree. In certain embodiments, unlike FIG. 5, the second sputter gun 220 may be disposed in such a way that the second target 222 is inclined to the substrate 100 at a predetermined angle. In other words, the second surface 222b of the second target 222 may be pointed toward the substrate 100. In this case, the second angle may be greater than about 0 degree and smaller than about 60 degrees. Likewise, the third sputter gun 230 may include a third plate 234 supplying power to the third target 232. The third target 232 may have a first surface 232a being in direct contact with the third plate 234, and a second surface 232b opposite to the first surface 232a. The third sputter gun 230 may be disposed such that the second surface 232b of the third target 232 is pointed toward inside of the process chamber 200. As illustrated in FIG. 5, the third sputter gun 230 may be disposed such that the normal line a perpendicular to the top surface of the substrate 100 is parallel to a normal line d perpendicular to the second surface 232b of the third target 232. In other words, a third angle between the normal line a of the top surface of the substrate 100 and the normal line d of the second surface 232b of the third target 232 may be about 0 degree. In certain embodiments, unlike FIG. 5, the third sputter gun 230 may be disposed in such a way that the third target 232 is inclined to the substrate 100 at a predetermined angle. In other words, the second surface 232b of the third target 232 may be pointed toward the substrate 100. In this case, the third angle may be greater than about 0 degree and smaller than about 60 degrees. In some embodiments, the first angle, the second angle, and the third angle may be equal to each other.

The first sputter gun 210 may be spaced apart from the substrate 100 by a first horizontal distance d1 and may be fixed. That is, the first sputter gun 210 may be spaced apart from a sidewall of the substrate 100 by the first horizontal distance d1. In other words, the first sputter gun 210 may be laterally spaced apart from the sidewall of the substrate 100 by the first horizontal distance d1 when viewed from a plan view. The first horizontal distance d1 may be a horizontal distance measured from the sidewall of the substrate 100 to the first sputter gun 210 projected on an imaginary horizontal plane 100s laterally extending from the top surface of the substrate 100. In other words, the first horizontal distance d1 may be a horizontal distance between the substrate 100 and the first sputter gun 210 when viewed from a plan view. Thus, the first sputter gun 210 may be fixed at a position that does not vertically overlap with the substrate 100. The second sputter gun 220 may be spaced apart from the substrate 100 by a second horizontal distance d2 and may be fixed. That is, the second sputter gun 220 may be spaced apart from a sidewall of the substrate 100 by the second horizontal distance d2. In other words, the second sputter gun 220 may be laterally spaced apart from the sidewall of the substrate 100 by the second horizontal distance d2 when viewed from a plan view. The second horizontal distance d2 may be a horizontal distance measured from the sidewall of the substrate 100 to the second sputter gun 220 projected on the imaginary horizontal plane 100s. In other words, the second horizontal distance d2 may be a horizontal distance between the substrate 100 and the second sputter gun 220 when viewed from a plan view. Thus, the second sputter gun 220 may be fixed at a position that does not vertically overlap with the substrate 100. Likewise, the third sputter gun 230 may be spaced apart from the substrate 100 by a third horizontal distance d3 and may be fixed. That is, the third sputter gun 230 may be spaced apart from a sidewall of the substrate 100 by the third horizontal distance d3. In other words, the third sputter gun 230 may be laterally spaced apart from the sidewall of the substrate 100 by the third horizontal distance d3 when viewed from a plan view. The third horizontal distance d3 may be a horizontal distance measured from the sidewall of the substrate 100 to the third sputter gun 230 projected on the imaginary horizontal plane 100s. In other words, the third horizontal distance d3 may be a horizontal distance between the substrate 100 and the third sputter guns 230 when viewed from a plan view. Thus, the third sputter gun 230 may be fixed at a position that does not vertically overlap with the substrate 100. In some embodiments, as illustrated in FIG. 6, the first to third sputter guns 210, 220 and 230 may be arranged to constitute one column in a plan view, and the second sputter gun 220 and the third sputter gun 230 may be spaced apart from each other with the first sputter gun 210 interposed therebetween in a plan view. In this case, the substrate 100 may be more adjacent to the first sputter gun 210 than to the second and third sputter guns 220 and 230. In other words, the second and third distances d2 and d3 may be greater than the first distance d1.

While the sputtering process is performed in the process chamber 200, the substrate holder 206 may fix the horizontal position of the substrate 100 and the first to third sputter guns 210, 220 and 230 may be fixed at the positions not vertically overlapping with the substrate 100, respectively. Thus, as described with reference to FIGS. 1 and 2, when sputtering sources deposited on outer surfaces of the first to third sputter guns 210, 220 and 230 are detached therefrom during the sputtering process, it is possible to inhibit the detached sputtering sources from falling onto the substrate 100. As a result, it is possible to inhibit the substrate 100 from being contaminated by the detached sputtering sources.

The sputtering apparatus 500 may include a shutter 240 provided in the process chamber 200 and a shutter supporter 242 provided in the process chamber 200 to support the shutter 240. The shutter 240 may be disposed between the substrate 100 and the first sputter gun 210, between the substrate 100 and the second sputter gun 220, and between the substrate 100 and the third sputter gun 230. The shutter 240 may have a plate shape that extends in the arrangement direction of the first to third sputter guns 210, 220 and 230 and extends in a direction perpendicular to the top surface of the substrate 100. Even though not shown in the drawings, the shutter 240 may have a circular plate shape. However, embodiments of the inventive concepts are not limited thereto. The shutter 240 may be provided at one side of the substrate 100 when viewed from one cross-sectional view. In this case, each of the first to third sputter guns 210, 220 and 230 may be spaced apart from the substrate 100 with the shutter 240 interposed therebetween. The shutter supporter 242 may vertically move the shutter 240 to control a vertical position of the shutter 240.

The shutter 240 may protect the substrate 100 during a pre-sputtering process. The pre-sputtering process may be performed in the process chamber 200 before the sputtering process to remove impurities existing on surfaces of the first to third targets 212, 222 and 232. During the pre-sputtering process, the shutter 240 may cover the sidewall of the substrate 100 and one-sidewalls of the first to third sputter guns 210, 220 and 230 and may protect the substrate 100 from the impurities detached from the first to third targets 212, 222 and 232. In other words, the shutter 240 may inhibit the substrate 100 from being contaminated by the impurities falling during the pre-sputtering process. After the pre-sputtering process, the shutter 240 may be moved by the shutter supporter 242 so as to be removed from the sidewall of the substrate 100 and the one-sidewalls of the first to third sputter guns 210, 220 and 230. Thereafter, the sputtering process may be performed on the top surface of the substrate 100.

A magnetic memory device may be manufactured using the sputtering apparatus 500 described above. Hereinafter, a method of manufacturing a magnetic memory device will be described.

Figure 7:
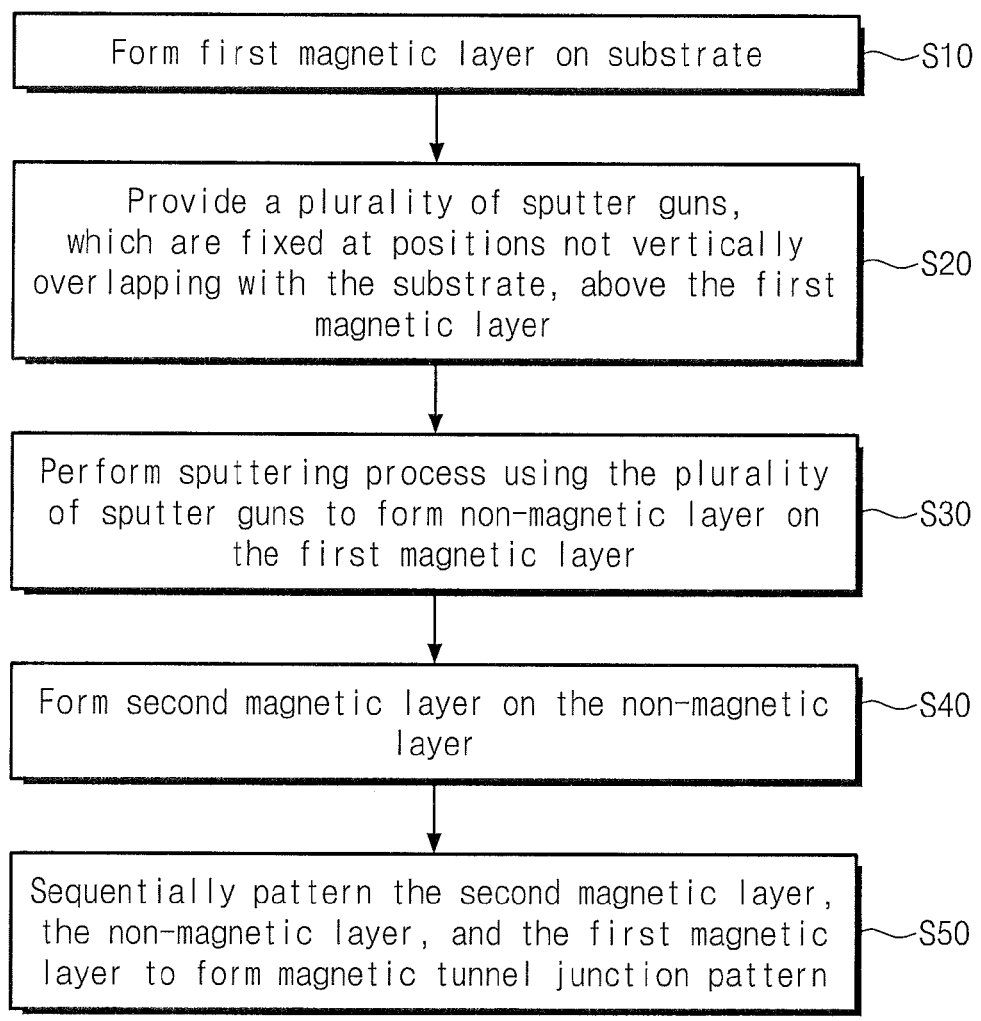
FIG. 7 is a flow chart illustrating a method of manufacturing a magnetic memory device, according to some embodiments of the inventive concepts.
Figure 12:
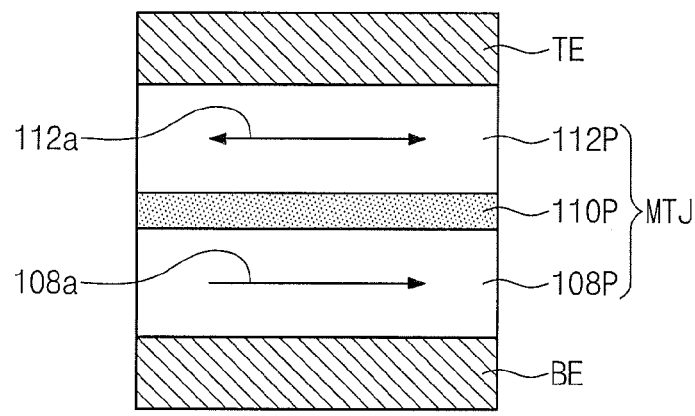
FIG. 12 is a cross-sectional view illustrating an embodiment of a magnetic tunnel junction pattern manufactured according to some embodiments of the inventive concepts.
Figure 13:
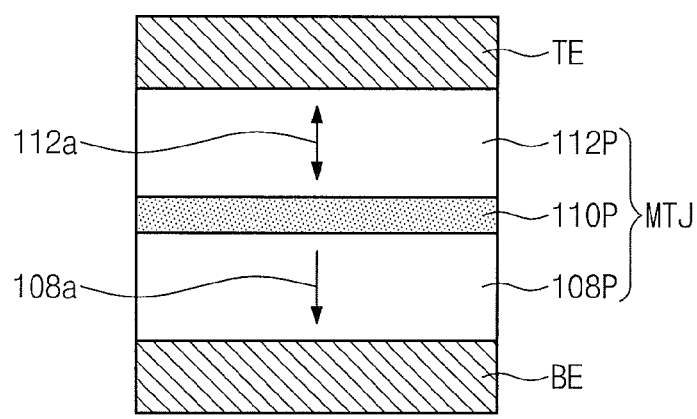
FIG. 13 is a cross-sectional view illustrating an embodiment of a magnetic tunnel junction pattern manufactured according to some embodiments of the inventive concepts.

FIG. 7 is a flow chart illustrating a method of manufacturing a magnetic memory device, according to some embodiments of the inventive concepts, and FIGS. 8 to 11 are cross-sectional views illustrating a method of manufacturing a magnetic memory device, according to some embodiments of the inventive concepts. FIG. 12 is a cross-sectional view illustrating an embodiment of a magnetic tunnel junction pattern manufactured according to some embodiments of the inventive concepts. FIG. 13 is a cross-sectional view illustrating an embodiment of a magnetic tunnel junction pattern manufactured according to some embodiments of the inventive concepts.

Figure 8:
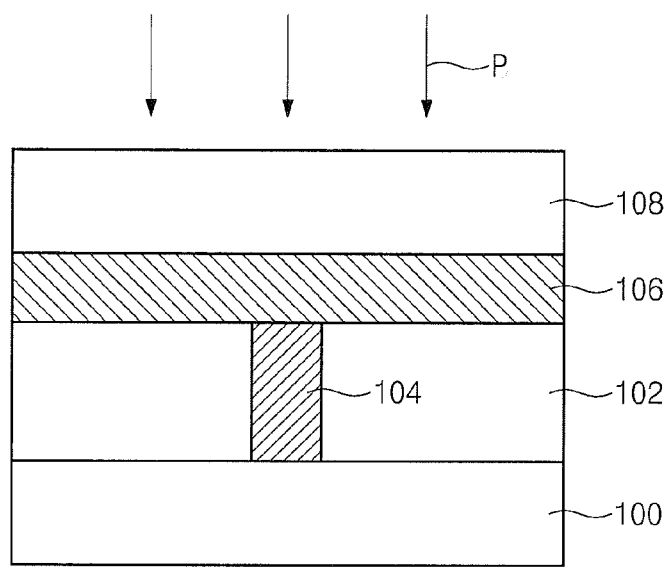
FIGS. 8 to 11 are cross-sectional views illustrating a method of manufacturing a magnetic memory device, according to some embodiments of the inventive concepts.

Referring to FIGS. 7 and 8, a lower interlayer insulating layer 102 may be formed on a substrate 100. The substrate 100 may include a semiconductor substrate. For example, the substrate 100 may include a silicon substrate, a germanium substrate, or a silicon-germanium substrate. In some embodiments, selection elements (not shown) may be formed on the substrate 100, and the lower interlayer insulating layer 102 may be formed to cover the selection elements. The selection elements may be field effect transistors. Alternatively, the selection elements may be diodes. The lower interlayer insulating layer 102 may be formed of a single layer or multi-layer including at least one of an oxide layer (e.g., a silicon oxide layer), a nitride layer (e.g., a silicon nitride layer), or an oxynitride layer (e.g., a silicon oxynitride layer).

Lower contact plugs 104 may be formed in the lower interlayer insulating layer 102. Each of the lower contact plugs 104 may penetrate the lower interlayer insulating layer 102 so as to be electrically connected to one terminal of a corresponding one of the selection elements. The lower contact plugs 104 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide).

A lower electrode layer 106 may be formed on the lower interlayer insulating layer 102. The lower electrode layer 106 may include a conductive metal nitride such as titanium nitride and/or tantalum nitride. In some embodiments, the lower electrode layer 106 may include a material (e.g., ruthenium (Ru)) capable of assisting crystal growth of magnetic layers to be described later. The lower electrode layer 106 may be formed by a sputtering process, a chemical vapor deposition (CVD) process, or an atomic layer deposition (ALD) process.

A first magnetic layer 108 may be formed on the lower electrode layer 106 (S10). The first magnetic layer 108 may be a pinned layer having a magnetization direction fixed in one direction or may be a free layer having a changeable magnetization direction. In some embodiments, the magnetization direction of the first magnetic layer 108 may be substantially perpendicular to an interface between the first magnetic layer 108 and a non-magnetic layer to be formed on the first magnetic layer 108. In this case, the first magnetic layer 108 may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. In certain embodiments, the magnetization direction of the first magnetic layer 108 may be substantially parallel to the interface between the first magnetic layer 108 and the non-magnetic layer to be formed on the first magnetic layer 108. In this case, the first magnetic layer 108 may include a ferromagnetic material. When the first magnetic layer 108 is the pinned layer, the first magnetic layer 108 may further include an anti-ferromagnetic material for fixing a magnetization direction of the ferromagnetic material. The first magnetic layer 108 may be formed by performing a physical vapor deposition (PVD) process or a CVD process.

A plurality of sputter guns may be provided above the first magnetic layer 108 in such a way that the sputter guns are fixed at positions not vertically overlapping with the substrate 100, respectively (S20).

In some embodiments, as described with reference to FIGS. 1 and 2, the plurality of sputter guns may include the first sputter gun 210 and the second sputter gun 220 which are provided above the first magnetic layer 108. The first sputter gun 210 and the second sputter gun 220 may include the first target 212 and the second target 222 installed thereon, respectively. The first target 212 and the second target 222 may include the same material. Each of the first and second targets 212 and 222 may include a metal oxide. For example, each of the first and second targets 212 and 222 may include at least one of magnesium oxide (MgO), titanium oxide (TiO), aluminum oxide (AlO), magnesium-zinc oxide (MgZnO), or magnesium-boron oxide (MgBO).

The first sputter gun 210 may be provided in such a way that the first target 212 is inclined to the substrate 100 at the first angle $\theta 1$. As described with reference to FIG. 2, the first angle $\theta 1$ may be an angle between the normal line a perpendicular to the top surface of the substrate 100 and the normal line b perpendicular to the second surface 212b of the first target 212. The first angle $\theta 1$ may range from about 60 degrees to about 90 degrees. The second sputter gun 220 may be provided in such a way that the second target 222 is inclined to the substrate 100 at the second angle θ2. As described with reference to FIG. 2, the second angle θ2 may be an angle between the normal line a perpendicular to the top surface of the substrate 100 and the normal line c perpendicular to the second surface 222b of the second target 222. The second angle θ2 may range from about 60 degrees to about 90 degrees. In some embodiments, the first angle θ1 may be equal to the second angle θ2. The first sputter gun 210 may face the second sputter gun 220. As described with reference to FIG. 2, the first sputter gun 210 may be fixed in a state in which it may be spaced apart from the first sidewall of the substrate 100 by the first horizontal distance d1. The second sputter gun 220 may be fixed in a state in which it may be spaced apart from the second sidewall of the substrate 100 by the second horizontal distance d2. Thus, the first and second sputter guns 210 and 220 may be respectively fixed at the positions which do not vertically overlap with the substrate 100.

In certain embodiments, as described with reference to FIGS. 3 to 6, the plurality of sputter guns may include the first sputter gun 210, the second sputter gun 220, and the third sputter gun 230 which are provided above the first magnetic layer 108 and are provided at one side of the substrate 100 when viewed from a cross-sectional view. The first to third sputter guns 210, 220, and 230 may be arranged in one direction (or, unlike shown, along a sidewall of the substrate 100) at one side of the substrate 100 when viewed from a plan view. The first sputter gun 210, the second sputter gun 220, and the third sputter gun 230 may respectively include the first target 212, the second target 222, and the third target 232, which are installed thereon. The first to third targets 212, 222 and 232 may include the same material. Each of the first to third targets 212, 222 and 232 may include a metal oxide. For example, each of the first to third targets 212, 222 and 232 may include at least one of magnesium oxide (MgO), titanium oxide (TiO), aluminum oxide (AlO), magnesium-zinc oxide (MgZnO), or magnesium-boron oxide (MgBO).

In some embodiments, as illustrated in FIG. 5, the first to third sputter guns 210, 220 and 230 may be disposed in such a way that the normal line a perpendicular to the top surface of the substrate 100 is parallel to the normal lines b, c and d respectively perpendicular to the second surfaces 212b, 222b and 232b of the first to third targets 212, 222 and 232. In certain embodiments, unlike FIG. 5, each of the first to third sputter guns 210, 220 and 230 may be disposed in such a way that each of the first to third targets 212, 222 and 232 is inclined to the substrate 100 at a predetermined angle. In other words, each of the second surfaces 212b, 222b and 232b of the first to third targets 212, 222 and 232 may be pointed toward the substrate 100. As described with reference to FIGS. 5 and 6, the first sputter gun 210 may be spaced apart from the sidewall of the substrate 100 by the first horizontal distance d1 and may be fixed. The second sputter gun 220 may be spaced apart from the sidewall of the substrate 100 by the second horizontal distance d2 and may be fixed. Likewise, the third sputter gun 230 may be spaced apart from the sidewall of the substrate 100 by the third horizontal distance d3 and may be fixed. Thus, each of the first to third sputter guns 210, 220 and 230 may be fixed not to vertically overlap with the substrate 100.

Thereafter, a sputtering process P using the plurality of sputter guns may be performed on the first magnetic layer 108. The sputtering process P may be a radio-frequency (RF) sputtering process.

Figure 9:
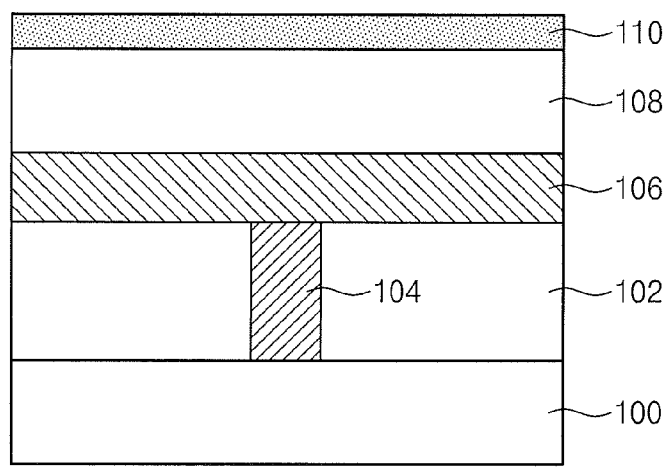

Referring to FIGS. 7 and 9, the sputtering process P using the plurality of sputter guns may be performed to form a non-magnetic layer 110 on the first magnetic layer 108 (S30). The non-magnetic layer 110 may be a tunnel barrier layer. The non-magnetic layer 110 may include the same material as the targets (e.g., the first to third targets 212, 222 and 232) respectively installed on the plurality of sputter guns. In some embodiments, the non-magnetic layer 110 may include a metal oxide. For example, the non-magnetic layer 110 may include at least one of magnesium oxide (MgO), titanium oxide (TiO), aluminum oxide (AlO), magnesium-zinc oxide (MgZnO), or magnesium-boron oxide (MgBO).

According to some embodiments of the inventive concepts, the plurality of sputter guns may be respectively fixed at the positions not vertically overlapping with the substrate 100 during the sputtering process P. Thus, as described with reference to FIGS. 1 and 2, when sputtering sources deposited on outer surfaces of the plurality of sputter guns are detached therefrom during the sputtering process, it is possible to inhibit the detached sputtering sources from falling onto the substrate 100. As a result, it is possible to inhibit the substrate 100 from being contaminated during the formation of the non-magnetic layer 110. In addition, since the non-magnetic layer 110 is formed using the plurality of targets including the same material, a deposition rate of the non-magnetic layer 110 may be increased. Thus, mass production of the magnetic memory device may be easy.

Figure 10:
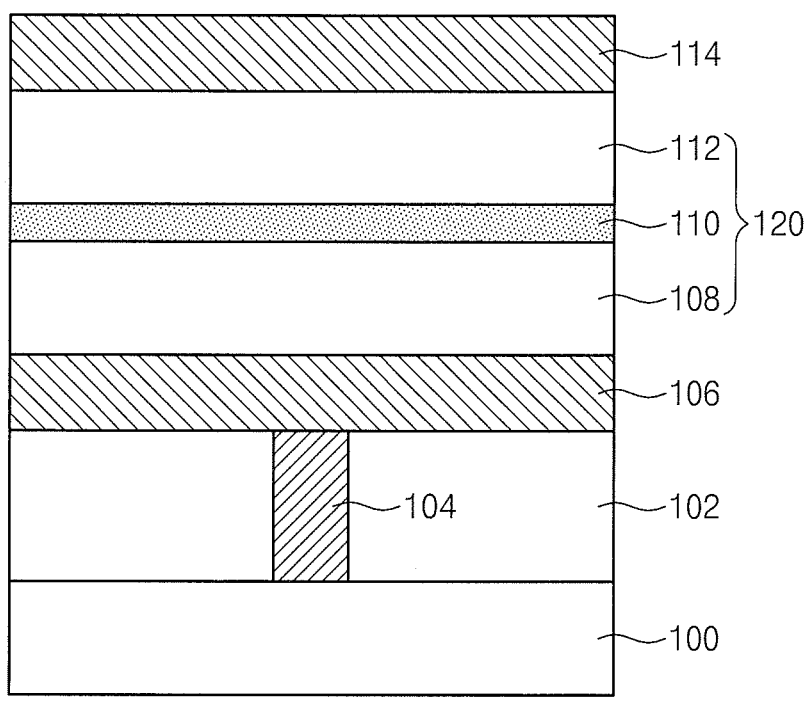

Referring to FIGS. 7 and 10, a second magnetic layer 112 may be formed on the non-magnetic layer 110 (S40). The second magnetic layer 112 may be a pinned layer having a magnetization direction fixed in one direction or may be a free layer having a changeable magnetization direction. One of the first and second magnetic layers 108 and 112 may correspond to the pinned layer having the magnetization direction fixed in the one direction, and the other of the first and second magnetic layers 108 and 112 may correspond to the free layer having the magnetization direction changeable to be parallel or anti-parallel to the fixed magnetization direction of the pinned layer.

In some embodiments, the magnetization direction of the second magnetic layer 112 may be substantially perpendicular to an interface between the non-magnetic layer 110 and the second magnetic layer 112. In this case, the second magnetic layer 112 may include at least one of a perpendicular magnetic material (e.g., CoFeTb, CoFeGd, or CoFeDy), a perpendicular magnetic material having the $L1_0$ structure, a CoPt alloy having the HCP lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. In certain embodiments, the magnetization direction of the second magnetic layer 112 may be substantially parallel to the interface between the non-magnetic layer 110 and the second magnetic layer 112. In this case, the second magnetic layer 112 may include a ferromagnetic material. When the second magnetic layer 112 is the pinned layer, the second magnetic layer 112 may further include an anti-ferromagnetic material for fixing a magnetization direction of the ferromagnetic material. The second magnetic layer 112 may be formed by performing a PVD process or a CVD process.

The first magnetic layer 108, the non-magnetic layer 110, and the second magnetic layer 112 may constitute a magnetic tunnel junction layer 120. An upper electrode layer 114 may be formed on the second magnetic layer 112. For example, the upper electrode layer 114 may include at least one of tungsten, titanium, tantalum, aluminum, or a metal nitride (e.g., titanium nitride or tantalum nitride). The upper electrode layer 114 may be formed by a sputtering process, a CVD process, or an ALD process.

Figure 11:
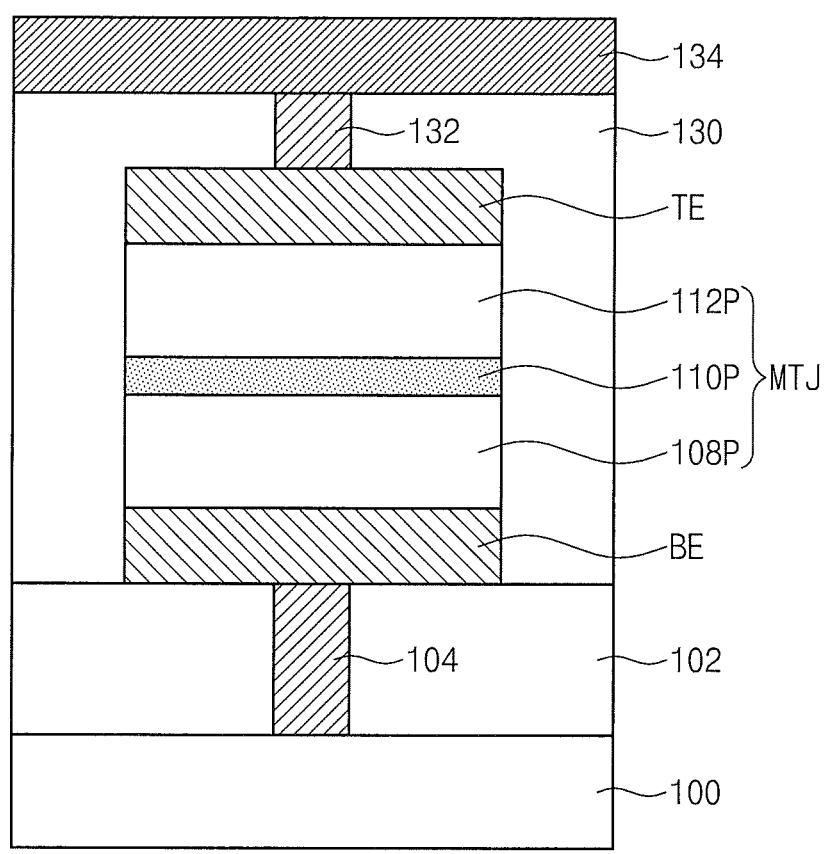

Referring to FIGS. 7 and 11, the second magnetic layer 112, the non-magnetic layer 110, and the first magnetic layer 108 may be sequentially patterned to form a magnetic tunnel junction pattern MTJ (S50). In some embodiments, the upper electrode layer 114 may be patterned to form an upper electrode TE. The upper electrode TE may define a region in which the magnetic tunnel junction pattern MTJ will be formed. The second magnetic layer 112, the non-magnetic layer 110, the first magnetic layer 108, and the lower electrode layer 106 may be sequentially etched using the upper electrode TE as an etch mask to form a second magnetic pattern 112P, a non-magnetic pattern 110P, a first magnetic pattern 108P, and a lower electrode BE. The magnetic tunnel junction pattern MTJ may include the first magnetic pattern 108P, the non-magnetic pattern 110P, and the second magnetic pattern 112P which are sequentially stacked on the lower electrode BE.

Each of the upper electrode TE, the magnetic tunnel junction pattern MTJ, and the lower electrode BE may be formed in plurality. The plurality of lower electrodes BE may be electrically connected to the plurality of lower contact plugs 104 formed in the lower interlayer insulating layer 102, respectively. The plurality of magnetic tunnel junction patterns MTJ may be formed on the plurality of lower electrodes BE, respectively. The plurality of upper electrodes TE may be formed on the plurality of magnetic tunnel junction patterns MTJ, respectively. Each of the magnetic tunnel junction patterns MTJ may include the first magnetic pattern 108P, the non-magnetic pattern 110P, and the second magnetic pattern 112P which are sequentially stacked on each of the lower electrodes BE.

In some embodiments, as illustrated in FIG. 12, magnetization directions 108a and 112a of the first and second magnetic patterns 108P and 112P may be substantially parallel to the interface between the non-magnetic pattern 110P and the second magnetic pattern 112P. FIG. 12 illustrates an embodiment in which the first magnetic pattern 108P is the pinned layer and the second magnetic pattern 112P is the free layer. However, embodiments of the inventive concepts are not limited thereto. Unlike FIG. 12, the first magnetic pattern 108P may be the free layer and the second magnetic pattern 112P may be the pinned layer.

Each of the first and second magnetic patterns 108P and 112P having the parallel magnetization directions 108a and 112a may include a ferromagnetic material. The first magnetic pattern 108P may further include an anti-ferromagnetic material for fixing a magnetization direction of the ferromagnetic material included in the first magnetic pattern 108P.

In certain embodiments, as illustrated in FIG. 13, magnetization directions 108a and 112a of the first and second magnetic patterns 108P and 112P may be substantially perpendicular to the interface between the non-magnetic pattern 110P and the second magnetic pattern 112P. FIG. 13 illustrates an embodiment in which the first magnetic pattern 108P is the pinned layer and the second magnetic pattern 112P is the free layer. Alternatively, unlike FIG. 13, the first magnetic pattern 108P may be the free layer and the second magnetic pattern 112P may be the pinned layer.

Each of the first and second magnetic patterns 108P and 112P having the perpendicular magnetization directions 108a and 112a may include at least one of a perpendicular magnetic material (e.g., CoFeTb, CoFeGd, or CoFeDy), a perpendicular magnetic material having the $L1_0$ structure, a CoPt alloy having the HCP lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

Referring again to FIGS. 7 and 11, an upper interlayer insulating layer 130 may be formed on the lower interlayer insulating layer 102 to cover the lower electrode BE, the magnetic tunnel junction pattern MTJ, and the upper electrode TE. The upper interlayer insulating layer 130 may be single-layered or multi-layered. For example, the upper interlayer insulating layer 130 may include at least one of an oxide layer (e.g., a silicon oxide layer), a nitride layer (e.g., a silicon nitride layer), or an oxynitride layer (e.g., silicon oxynitride layer).

An upper contact plug 132 may be formed in the upper interlayer insulating layer 130 so as to be connected to the upper electrode TE. In some embodiments, forming the upper contact plug 132 may include forming a contact hole exposing the upper electrode TE in the upper interlayer insulating layer 130, and forming the upper contact plug 132 in the contact hole.

An interconnection 134 may be formed on the upper interlayer insulating layer 130. The interconnection 134 may extend in one direction and may be electrically connected to a plurality of the magnetic tunnel junction patterns MTJ arranged in the one direction. Each of the plurality of the magnetic tunnel junction patterns MTJ may be electrically connected to the interconnection 134 through a corresponding upper electrode TE and the upper contact plug 132 connected to the corresponding upper electrode TE. In some embodiments, the interconnection 134 may function as a bit line.

Figure 14:
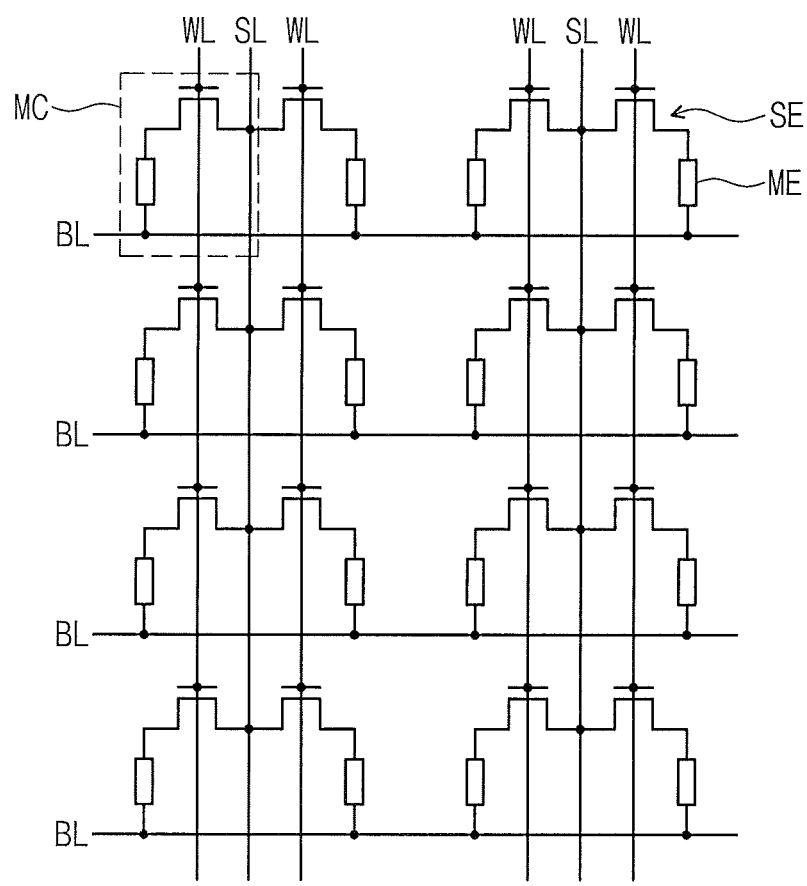
FIG. 14 is a circuit diagram illustrating a cell array of a magnetic memory device manufactured according to some embodiments of the inventive concepts.

FIG. 14 is a circuit diagram illustrating a cell array of a magnetic memory device manufactured according to some embodiments of the inventive concepts.

Referring to FIG. 14, a plurality of unit memory cells MC may be two-dimensionally or three-dimensionally arranged in a cell array. Each of the unit memory cells MC may be electrically connected between a word line WL and a bit line BL which intersect each other. Each of the unit memory cells MC may include a memory element ME and a selection element SE. The selection element SE and the memory element ME may be electrically connected in series to each other.

The memory element ME may be connected between the bit line BL and the selection element SE. The selection element SE may be disposed between the memory element ME and a source line SL and may be controlled by the word line WL. The memory element ME may be a variable resistance element of which a resistance state is switchable between two different resistance states by an electrical pulse applied thereto. In some embodiments, the memory element ME may have a thin layer structure of which an electrical resistance is changeable using spin transfer torque of electrons of a program current passing therethrough. The memory element ME may have a thin layer structure showing a magnetoresistance characteristic and may include at least one ferromagnetic material and/or at least one antiferromagnetic material.

The selection element SE may selectively control supply of a current to the memory element ME in response to a voltage applied to the word line WL. The selection element SE may be a diode, a PNP bipolar transistor, an NPN bipolar transistor, an NMOS field effect transistor, or a PMOS field effect transistor. For example, when the selection element SE is the bipolar transistor or MOS field effect transistor corresponding to an element having three terminals, the cell array may further include the source line SL connected to a source electrode of the transistor. In some embodiments, the source line SL may be disposed between the word lines WL adjacent to each other, and two transistors may share one source line SL.

Figure 15:
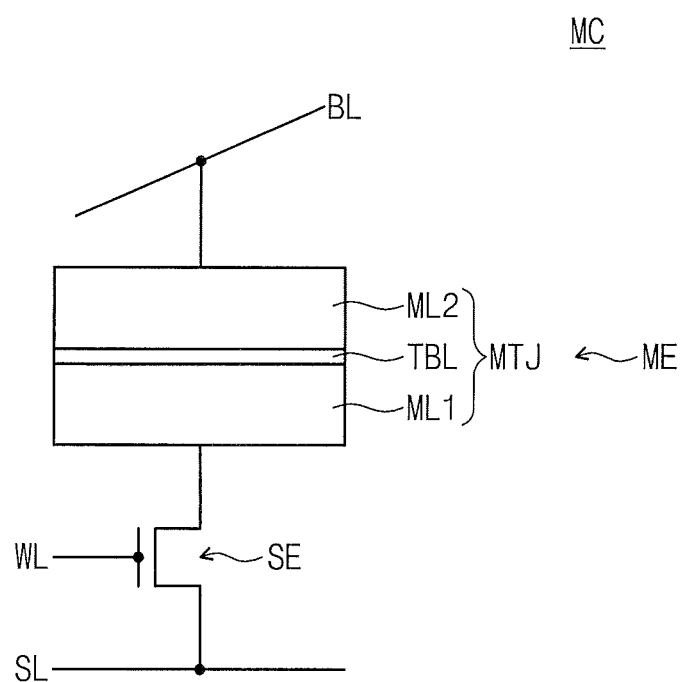
FIG. 15 is a diagram illustrating a unit memory cell of a magnetic memory device manufactured according to some embodiments of the inventive concepts.

FIG. 15 is a diagram illustrating a unit memory cell of a magnetic memory device manufactured according to some embodiments of the inventive concepts.

Referring to FIG. 15, each of unit memory cells MC may include a magnetic memory element ME and a selection element SE. The selection element SE and the magnetic memory element ME may be electrically connected in series to each other. The magnetic memory element ME may be connected between a bit line BL and the selection element SE. The selection element SE may be connected between the magnetic memory element ME and a source line SL and may be controlled by a word line WL.

The magnetic memory element ME may include a magnetic tunnel junction MTJ including magnetic layers ML1 and ML2 spaced apart from each other and a tunnel barrier layer TBL disposed between the magnetic layers ML1 and ML2. One of the magnetic layers ML1 and ML2 may be a pinned layer having a magnetization direction fixed regardless of an external magnetic field under normal usage environment. The other of the magnetic layers ML1 and ML2 may be a free layer of which a magnetization direction is changeable by a program magnetic field or spin torque of electrons of a program current.

An electrical resistance of the magnetic tunnel junction MTJ when the magnetization directions of the pinned and free layers are anti-parallel to each other may be much higher than that of the magnetic tunnel junction MTJ when the magnetization directions of the pinned and free layers are parallel to each other. In other words, the electrical resistance of the magnetic tunnel junction MTJ may be adjusted by changing the magnetization direction of the free layer. Thus, logical data may be stored in the magnetic memory element ME of the unit memory cell MC by means of an electrical resistance difference according to the magnetization directions of the pinned and free layers.

According to some embodiments of the inventive concepts, the sputtering apparatus may include the plurality of sputter guns provided in the process chamber, and the sputtering process may be performed using the plurality of sputter guns in the process chamber. The plurality of sputter guns may be respectively fixed at the positions not vertically overlapping with the substrate during the sputtering process. The sputtering sources deposited on the outer surfaces of the plurality of sputter guns may be detached therefrom during the sputtering process. At this time, since the plurality of sputter guns do not vertically overlap with the substrate during the sputtering process, it is possible to inhibit the detached sputtering sources from falling onto the substrate. As a result, it is possible to inhibit the substrate from being contaminated during the sputtering process.

When the non-magnetic layer of the magnetic tunnel junction is formed using the sputtering apparatus, it is possible to inhibit the substrate (e.g., the non-magnetic layer) from being contaminated during the formation of the non-magnetic layer. Thus, the magnetic memory device with excellent reliability may be manufactured. In addition, the plurality of sputter guns may include the plurality of targets having the same material, respectively, and the non-magnetic layer may be formed using the plurality of targets. Thus, the deposition rate of the non-magnetic layer may be increased. As a result, the mass production of the magnetic memory device may be easy.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A sputtering apparatus, comprising:
a process chamber;
a substrate holder within the process chamber and that is configured to fix a horizontal position of a substrate during a sputtering process;
a first sputter gun vertically spaced apart from the substrate in the process chamber, the first sputter gun including a first target;
a second sputter gun vertically spaced apart from the substrate in the process chamber, the second sputter gun including a second target;
wherein the first sputter gun and the second sputter gun are located on a same side of the substrate relative to a normal line perpendicular to a top surface of the substrate when viewed from a cross-sectional view,
wherein the first sputter gun is horizontally spaced apart from the substrate by a first distance during the sputtering process, and wherein the second sputter gun is horizontally spaced apart from the substrate by a second distance during the sputtering process.

2. The sputtering apparatus of claim 1,
wherein the first sputter gun is fixed at a first position during the sputtering process,
wherein the second sputter gun is fixed at a second position during the sputtering process.

3. The sputtering apparatus of claim 2, wherein the first and second sputter guns are fixed at the respective first and second positions so as not to vertically overlap with the substrate during the sputtering process.

4. The sputtering apparatus of claim 2, wherein the first and second targets comprise the same material.

5. The sputtering apparatus of claim 4, wherein the first target and the second target comprise a metal oxide.

6. The sputtering apparatus of claim 4, wherein the first sputter gun further comprises:
a first plate configured to supply power to the first target,
wherein the first target has a first surface in direct contact with the first plate and a second surface opposite to the first surface, and wherein a first angle between a first normal line perpendicular to the second surface of the first target and the normal line perpendicular to the top surface of the substrate ranges from 0 degrees to 60 degrees.

7. The sputtering apparatus of claim 6, wherein the second sputter gun further comprises:
a second plate configured to supply power to the second target,
wherein the second target has a first surface and a second surface opposite to each other,
wherein the first surface of the second target is in direct contact with the second plate, and
wherein a second angle between a second normal line perpendicular to the second surface of the second target and the normal line perpendicular to the top surface of the substrate ranges from 0 degrees to 60 degrees.

8. The sputtering apparatus of claim 1, further comprising:
a shutter provided in the process chamber to protect the substrate during a pre-sputtering process performed on the first and second targets,
wherein the shutter is provided at one side of the substrate between the first and second sputter guns and the substrate; and
wherein the shutter has a plate shape that extends in an arrangement direction of the first and second sputter guns and that extends in a direction perpendicular to the top surface of the substrate.

9. A method of manufacturing a magnetic memory device, the method comprising:
forming a first magnetic layer on a substrate;
forming a non-magnetic layer on the first magnetic layer; and
forming a second magnetic layer on the non-magnetic layer,
wherein forming the non-magnetic layer comprises:
performing a sputtering process using a first sputter gun and a second sputter gun, wherein the first sputter gun and the second sputter gun are each vertically spaced apart from the first magnetic layer, wherein the first sputter gun comprises a first target, and wherein the second sputter gun comprises a second target;
wherein the first sputter gun and the second sputter gun are located on a same side of the substrate relative to a normal line perpendicular to a top surface of the substrate when viewed from a cross-sectional view, and wherein the first sputter gun and the second sputter gun are horizontally spaced apart from each other,
wherein the first sputter gun is horizontally spaced apart from the substrate by a first distance during the sputtering process, and wherein the second sputter gun is horizontally spaced apart from the substrate by a second distance during the sputtering process, and
wherein the normal line perpendicular to the top surface of the substrate is parallel to a first normal line perpendicular to a surface of the first target and parallel to a second normal line perpendicular to a surface of the second target.

10. The method of claim 9,
wherein the first sputter gun is fixed at a first position during the sputtering process, and
wherein the second sputter gun is fixed at a second position during the sputtering process.

11. A sputtering apparatus, comprising:
a process chamber;
a substrate holder within the process chamber, wherein the substrate holder is configured to fix a horizontal position of a substrate during a sputtering process; and
first and second sputter guns positioned above the substrate in the process chamber, wherein the first and second sputter guns are each vertically spaced apart from the substrate, and the first and second sputter guns are each horizontally spaced apart from the substrate by respective first and second distances, wherein the first sputter gun and the second sputter gun are located on a same side of the substrate relative to a normal line perpendicular to a top surface of the substrate when viewed from a cross-sectional view,
wherein the first sputter gun comprises a first target, wherein the second sputter gun comprises a second target, and wherein the first and second targets are pointed toward the substrate; and
a shutter provided at one side of the substrate between the first and second sputter guns and the substrate,
wherein the shutter has a plate shape and extends in a direction perpendicular to the top surface of the substrate.

12. The sputtering apparatus of claim 11, wherein the first and second targets comprise the same material.

13. The sputtering apparatus of claim 12, wherein the first target and the second target comprise a metal oxide.

14. The sputtering apparatus of claim 12, wherein the first sputter gun comprises a first plate configured to supply power to the first target, wherein the first target has a first surface in direct contact with the first plate and a second surface opposite to the first surface, wherein the first sputter gun is disposed such that the second surface of the first target is pointed toward the substrate, and wherein a first angle between a normal line perpendicular to the second surface of the first target and the normal line perpendicular to the top surface of the substrate ranges from 0 degrees to 60 degrees.

15. The sputtering apparatus of claim 14, wherein the second sputter gun comprises a second plate configured to supply power to the second target, wherein the second target has a first surface and a second surface opposite to each other, wherein the first surface of the second target is in direct contact with the second plate, wherein the second sputter gun is disposed such that the second surface of the second target is pointed toward the substrate, and wherein a second angle between a normal line perpendicular to the second surface of the second target and the normal line perpendicular to the top surface of the substrate ranges from 0 degrees to 60 degrees.

* * * * *